United States Patent [19]

Carobolante

[11] Patent Number: 5,338,977
[45] Date of Patent: Aug. 16, 1994

[54] COMPENSATED CIRCUIT FOR DRIVING INDUCTIVE LOADS WITH VERY HIGH BANDWIDTH

[75] Inventor: Francesco Carobolante, Phoenix, Ariz.

[73] Assignee: SGS-Thomson Microelectronics, Inc., Carrollton, Tex.

[21] Appl. No.: 9,433

[22] Filed: Jan. 27, 1993

Related U.S. Application Data

[63] Continuation of Ser. No. 783,839, Oct. 29, 1991, abandoned.

[51] Int. Cl.$^5$ .................. H03K 17/687; H03K 3/01; H02K 29/00
[52] U.S. Cl. .................. 307/270; 307/571; 307/491; 318/138; 388/815
[58] Field of Search .............. 307/571, 443, 546, 555, 307/228, 270, 253, 263, 491; 318/138, 254; 388/815, 821, 822

[56] References Cited

U.S. PATENT DOCUMENTS

| | | | |
|---|---|---|---|
| 3,947,776 | 3/1976 | Stevens et al. | 307/270 |
| 4,441,068 | 4/1984 | Smith | 307/270 |
| 4,712,853 | 12/1987 | Howard | 388/815 |
| 4,739,230 | 4/1988 | Sonobe et al. | 318/138 |
| 4,933,614 | 6/1990 | Kawata | 388/821 |
| 5,004,965 | 4/1991 | Otokawa et al. | 318/254 |

OTHER PUBLICATIONS

IEEE Standard Dictionary of Electrical Terms, N.Y., N.Y. third ed., p. 108.

*Primary Examiner*—Timothy P. Callahan
*Assistant Examiner*—Toan Tran
*Attorney, Agent, or Firm*—Richard A. Bachand; Lisa K. Jorgenson; Richard K. Robinson

[57] ABSTRACT

A circuit for controlling a current in a load that includes an inductive component provides a high constant gain at low frequencies, a gain roll off at medium frequencies, and a low gain above unity gain at frequencies between the medium frequencies to high frequencies so that the gain roll off of the circuit to below unity gain is provided by a pole of the inductive load component. As a result, the circuit has a bandwidth limited only by the poles of the load. The circuit has a high gain amplifier with an input connected to receive a input control signal, and a low gain amplifier with an output connected to a control element of a switching element in a current path of the load. A frequency compensation circuit is connected between an output of the high gain amplifier and an input of the low gain amplifier, and includes a high frequency current bypass path and a resistor in series therewith operative to reduce the signal input to the low gain amplifier at high frequencies.

27 Claims, 1 Drawing Sheet

COMPENSATED CIRCUIT FOR DRIVING INDUCTIVE LOADS WITH VERY HIGH BANDWIDTH

This is a continuation of copending application(s) Ser. No. 07/783,839 filed on Oct. 29, 1991, now abandoned.

BACKGROUND OF THE INVENTION

1. Field of the Invention

This invention relates to improvements in electrical circuits, and, more particularly, to improvements in circuits for driving inductive loads for use in such application as dc motor drivers and the like.

2. Description of the Prior Art

In the design of motor controller circuits, typically a transconductance loop is provided that is stable for resistive loads, and that has an output current delivered to drive the motor in response to an input voltage. However, because such motors have associated inductive loads, the driver circuit loop may become unstable.

To stabilize the driver circuit loop, "snubber" networks are often employed. A typical snubber network comprises a resistor in series with a capacitor, connected in parallel with the inductive load. The effect of the snubber network can be seen in a Bode diagram as appearing resistive at higher frequencies, thereby limiting the apparent value of the impedance of the load. If the inductive pole of the load is made equal to the capacitive zero of the capacitor of the snubber, a constant resistance over frequency, in principle, might be achieved. The value of the resistor, on the other hand, may be provided in the range of tens to hundreds of ohms, so that at higher frequencies the value of the snubber resistor becomes the impedance that is seen in the load (the inherent resistance in the inductive coils being essentially negligible).

If the load is a part of the gain function, a low value of load is maintained, and, therefore, a low value of the gain function is maintained. Thus, a snubber circuit avoids an excessive increase of the gain of the circuit at higher frequencies. Another way of looking at the operation of the snubber is to consider the action of the resistor of the snubber circuit as reducing the Q of the coil of the motor and damping the energy stored in the inductor. It can be seen that one of the disadvantageous effects of such snubber circuits is the power dissipation required from the circuit. This power dissipation becomes especially significant in PWM type circuits due to the high currents that pass through the capacitor at the high switching frequencies employed.

The action of the snubber circuit in damping the voltage response of the load may be understood as follows. A discontinuity in the driving stage produces a significant spike in the output due to the inductive load. Thus, intrinsically a high frequency type of signal is generated at the output of the motor driver. Such high frequency components contribute significantly to the generation of electromagnetic interference (EMI). Such EMI is undesirable, especially in hard disk drive motor applications, since such high frequencies appear in the read-write channel associated with such hard disk drive.

Such snubber circuits as described above typically are used to decrease the noise content in the output between the driver circuit and the inductive load by decreasing the frequency bandwidth in which the noise occurs. Due to the intrinsic time constants of the load, the bandwidth of the loop oftentimes is in or below the audible frequency range. Since the torque of the motor is proportional to the current flowing through the motor, the ripple that is generated during transitions may produce audible noise that is oftentimes objectionable to a user. Moreover the ripple effects on the motor may also affect its precision.

In addition, typical snubber networks employ fairly large capacitors, for example, on the order of ten microfarads or higher often being used, commonly in the range of hundreds of nanofarads to microfarads. With resistors in the tens of ohms range, it can be seen that the snubber networks typically are required to employ power type components provided by discrete external component elements, and cannot be, for example, integrated into a part of a motor driver integrated circuit chip or the like. Such discrete component elements are bulky and expensive.

Another disadvantage of using snubber networks that produce significant ripple in the operation of motor drivers, particularly those used, for example, to drive computer hard disks or the like, is a reduction in the precision of the motor speed, which translates into reduced precision of the disk drive itself and the accuracy that can be achieved in inputting and outputting data to it.

SUMMARY OF THE INVENTION

It is an object of the invention to provide a circuit for driving an inductive load that has a very high bandwidth, and eliminates the need for previously required "snubber" circuits.

It is another object of the invention to provide a driver circuit of the type described which has a significantly decreased current response time, increased bandwidth, and increased performance.

It is another object of the invention to provide a driver circuit of the type described which reduces or eliminates current ripple to the load, and which enables a load to be driven to a desired current level with minimum overshoot.

It is another object of the invention to provide a driver circuit of the type described which enables very low torque ripple to be achieved in dc motor driver applications.

It is another object of the invention to provide a driver circuit of the type described which has a very rapid settling time in response to a step current input.

It is another object of the invention to provide a driver circuit of the type described that reduces audible noise in an associated dc motor load.

These and other objects, features, and advantages will become apparent to those skilled in the art from the following detailed description when read in conjunction with the accompanying drawing and appended claims.

Is yet another object of the invention to provide a driver circuit for a dc motor that does not require a snubber network compensation circuit.

In accordance with a broad aspect of the invention, a circuit is provided for controlling a current in a load that includes an inductive component. The circuit includes a current switch in a series current path with the load, a high gain amplifier, having an input connected to receive a input control signal, and a low gain amplifier connected to a control element of the current switch. A frequency compensation circuit is connected between an output of the high gain amplifier and an input of the low gain amplifier. The frequency compensation circuit includes a high frequency current bypass path and a resistor in series with it operative to reduce the signal input to the low gain amplifier at high frequencies. The gain rolloff of the circuit and load to below unity gain with increasing frequency is first furnished by the inductive component of the load.

The circuit is configured to provide a high constant gain at low frequencies, a gain roll off at medium frequencies, and a low gain above unity gain at frequencies between the medium frequencies to high frequencies so that the gain roll off of the circuit to below unity gain is provided by a pole of the inductive load component. As a result, the circuit has a bandwidth limited only by the poles of the load.

In accordance with another broad aspect of the invention, a method is provided for supplying a current over a wide bandwidth to a switching transistor in a series current path that includes a motor coil. The method includes the steps of providing a high gain amplifier, and connecting an input of the high gain amplifier to receive an input control signal. In addition, the method includes providing a unity gain amplifier, and connecting an output of the unity gain amplifier to a control element of the switching transistor. Finally the method includes the step of providing a frequency compensation circuit having a resistor connected to the input of the low gain amplifier, and a capacitor connected in series with the resistor to a reference potential.

BRIEF DESCRIPTION OF THE DRAWING

The invention is illustrated in the accompanying drawing in which.

DETAILED DESCRIPTION OF THE PREFERRED EMBODIMENT

Figure 1:
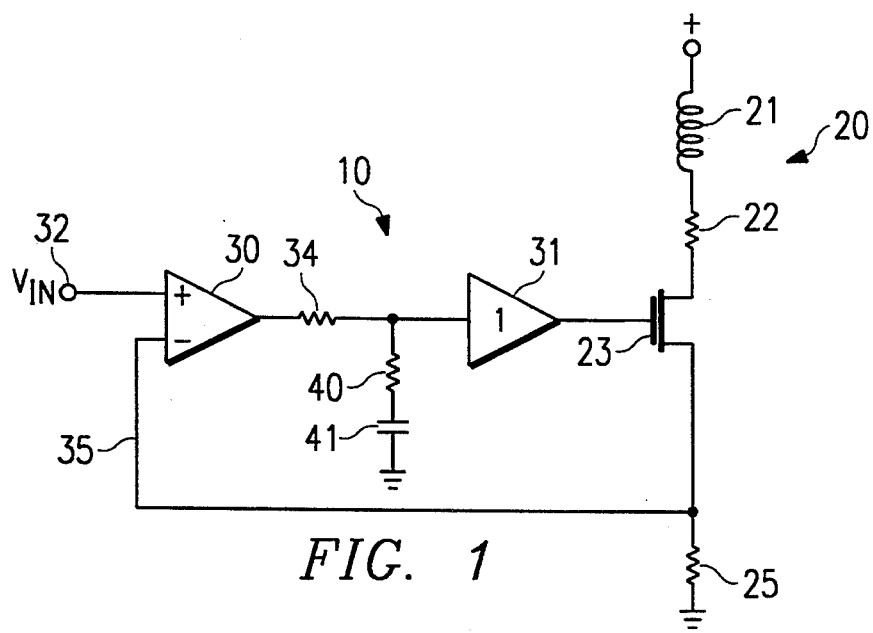
FIG. 1 is an electrical schematic diagram of a driver circuit, in accordance with a preferred embodiment of the invention, for providing drive current to an inductive load.

With reference now to FIG. 1, a driver circuit 10 is illustrated for providing drive current to a load 20 having an inductive component. The load 20 may be, for example, a coil 21 of a dc motor (not shown) to which drive current may be switchably applied in accordance with a predetermined commutative sequence. A resistor 22 is illustrated in series with the coil 21, and represents the intrinsic resistance of the coil 21. A power FET 23 is connected with its source-drain path in series between the coil 21 and a sense resistor 25. The coil 21 is connected to a source of potential, and the resistor 25 is connected to a reference potential, or ground as shown, to complete a series circuit between the source of potential and ground. The FET 23 series as a switching device to complete the circuit between the source of potential and ground, and may be replaced by other appropriate switching devices, such as an NPN transistor, or the like.

The driver circuit 10 includes a high gain operational amplifier 30 and a unity gain amplifier 31 connected between an input node 32 and a controlled element such as the gate shown of the FET 23. The input node 32 which may receive, for example, an output signal from a switching circuit switchably controlled by a commutative sequence in driving the motor (not shown) with which the coil 21 is associated, is connected to the non-inverting input of the operational amplifier 30. The output from the operational amplifier 30 is connected by a series resistor 34 to the input of the unity gain amplifier 31. A feedback loop 35 is provided between the inverting input of the operational amplifier 30 and the top of the sense resistor 25; consequently, when a voltage change is applied to the input node 32, the amplifier 30 will rapidly respond to the adjust the conduction state of the FET 23. As the voltage changes on the sense resistor 25, the voltage on the inverting input of the amplifier 30 correspondingly changes until it reaches the level of the voltage on the input node 32, at which time the operational amplifier 30 ceases to conduct. Given the fact that the circuit provides a non-zero gain in the loop at high frequencies, the speed at which the new current will be established will be limited by the rate of change allowed by the inductance of the load, and not by the circuit electronics.

A resistor 40 and a capacitor 41 are connected in series between the input of the unity gain amplifier 31 and ground. The capacitor 41 serves to provide a compensating pole at higher frequencies to reduce the high frequency gain of the signal applied to the input to the unity gain amplifier 31, and may be, for instance, of very small value, for example, in the range of nanofarads. The gain reduction is limited, however, at higher frequencies to the ratio of the voltage divider resistors 34 and 40. The circuitry, therefore, constitutes one way by which a pole followed by a zero prior to the pole inherent in the inductive load may be established with increasing frequency.

Figure 2:
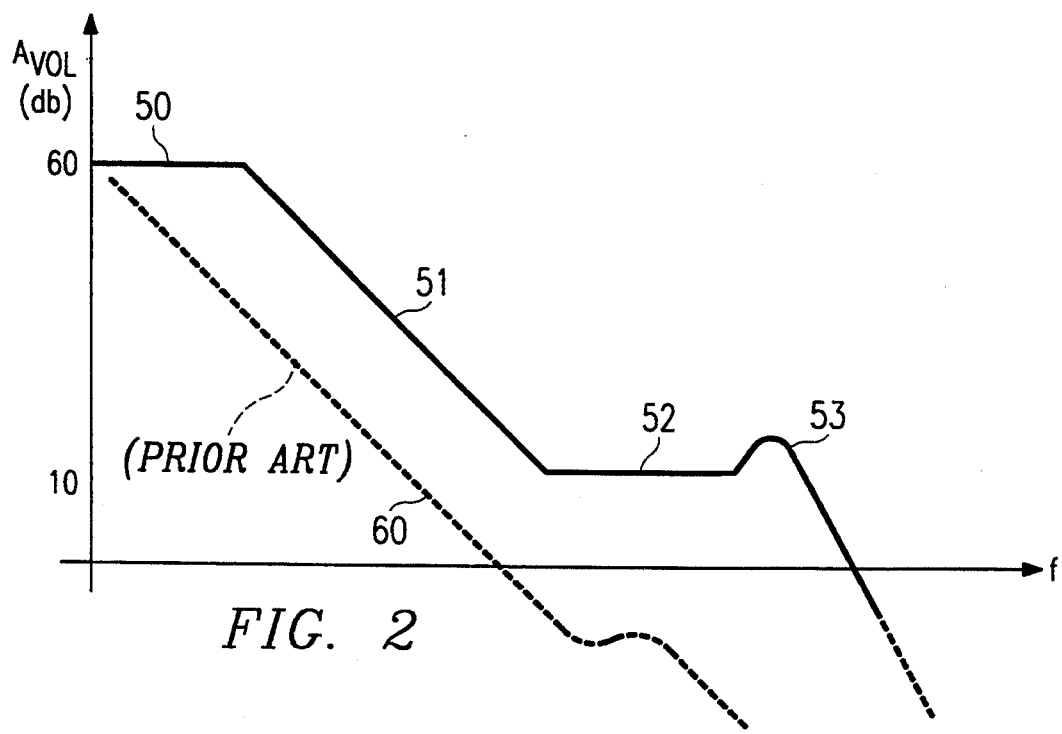
FIG. 2 is a Bode diagram showing the relationship of gain versus frequency in the operation of the circuit of FIG. 1, compared to the frequency and gain relationship of a prior art circuit compensated with a snubber network.

It should be noted that the high frequency effects of the inductive load introduced by the inductor 21 are connected essentially directly to the output of the unity gain amplifier 31 by the intrinsic capacitance existing within the FET 23 (essentially a Miller effect capacitance, not shown). Thus, a Bode plot of the gain of the circuit 10 in connection with the inductive load 20 is as shown in FIG. 2. At low frequencies, the gain provided by the operational amplifier 30 is effectively high, shown by the portion 50 of the solid line curve. As the frequency increases, the capacitor 41 becomes of dominant operation, causing the gain to roll off to a lower gain along the curve segment 51. At a frequency at which the capacitor 41 is no longer dominant, a relatively low gain determined by the ratio of the resistors 34 and 40 and the gain of the amplifier 30 is effective, as indicated by the curved segment 52. At a relatively high frequency, the pole inherently created by the inductance of the inductive load becomes a dominant factor in determining the gain (actually more than one pole exists at higher frequencies due to the presence of the inductive load), as indicated by the curved segment 53.

For comparison, the gain/frequency relationship of a typical prior art circuit employing a snubber circuit and a dominant pole type of compensation is shown by the dotted line curve 60. It can be seen that the bandwidth of the circuit represented by the curved segments 50-53 is significantly higher, for example, on the order of one or more orders of magnitude, than the bandwidth of the circuit represented by the dotted line curve 60.

It is important to note that in design of the driver circuit 10, the resistors 34 and 40 and the capacitor 41 may be sized to be realized by signal level components if desired, in contrast to the power handling components of prior art snubber compensating circuits. Also circuits with equivalent frequency response may be integrated onto an integrated circuit chip if desired with special techniques (like switched capacitors or the like).

It should also be noted that a gain of approximately 60 db provided at lower frequencies can be obtained with a single gain stage, such as provided by the operational amplifier 30. By using only a single gain stage, the creation of more than one compensating pole and zero can be avoided, thereby simplifying the design of the overall driver circuit 10. It should also be noted that although a high gain operational amplifier 30 has been illustrated, so called operational transconductance amplifiers (OTA) can be used instead. If such OTA is used, the function supplied by the resistor 34 can be provided by the effective output resistance of the OTA, which may be considered to be a resistor, $r_o$, in parallel with the resistor 40 and capacitor 41. The transfer function would be the same as shown in FIG. 2 above described.

It should also be noted that by virtue of the compensated driving circuit 10 as above described, the roll off at and beyond the curve segment 53 shown in FIG. 2 is imposed by virtue of the poles imposed by the load, in distinction to the prior art roll off imposed by a dominate pole on the driver and a load compensation circuit. Thus, the bandwidth that is realized by the circuit 10 is essentially the maximum bandwidth that is achievable in an inductive driver circuit of this type.

Although the invention has been described and illustrated with a certain degree of particularity, it is understood that the present disclosure has been made by way example only and that numerous changes in the combination and arrangement of parts may be resorted to by those skilled in the art without departing from the spirit and scope of the invention as hereinafter claimed.

I claim:

1. A circuit for controlling a current in a load having an inductive component, comprising:
    a sense resistor and a current control device in series with said load;
    a high gain differential amplifier, having a non-inverting input connected to receive an input control signal and having an inverting input connected to said sense resistor;
    a low gain amplifier having an input connected to receive an output of said high gain amplifier and an output connected to control said current control device;
    and a first compensation resistor and a capacitor in series between the input of the low gain amplifier and a reference potential, said resistor and capacitor being sized to insure that with increasing frequency a first gain rolloff to below unity gain is caused by said load.

2. The circuit of claim 1 wherein said low gain amplifier is a unity gain amplifier.

3. The circuit of claim 1 wherein said high gain differential amplifier has a single gain stage.

4. The circuit of claim 1 wherein said high gain differential amplifier is an operational amplifier.

5. The circuit of claim 1 wherein said high gain differential amplifier is an operational transconductance amplifier.

6. The circuit of claim 1 further comprising a second compensation resistor connected between the output of said high gain amplifier and said first compensation resistor, said second compensation resistor and said first compensation resistor establishing an input signal limit to said low gain amplifier.

7. The circuit of claim 1 wherein said load having an inductive component is a dc motor coil.

8. The circuit of claim 1 wherein said current control device is an FET.

9. The circuit of claim 1 wherein said current control device is a bipolar transistor.

10. A current driver circuit for applying a current to a switching transistor that is in a series current path with a motor coil, comprising:
    a high gain amplifier, having an input connected to receive an input motor control signal, and having a wide frequency bandwidth;
    a feedback circuit for applying a signal to an input of said high gain amplifier in response to a current in said current path;
    a low gain amplifier, and having an output connected to a control element of said switching transistor;
    and a frequency compensation circuit, said frequency compensation circuit comprising a first resistor connected to said input of said low gain amplifier, and a capacitor connected in series with said first resistor to a reference potential, said resistor and capacitor being sized to insure that with increasing frequency a first gain rolloff to below unity gain is caused by said load.

11. The circuit of claim 10 further comprising a second resistor connected between the output of said high gain amplifier and the input of said low gain amplifier.

12. The circuit of claim 10 wherein said low gain amplifier is a unity gain amplifier.

13. The circuit of claim 10 wherein said high gain amplifier has a single gain stage.

14. The circuit of claim 10 wherein said feedback circuit is connected to an inverting input of said high gain amplifier.

15. The circuit of claim 14 further comprising a sense resistor in said series current path, and across which a voltage is developed indicating the current in said series current path.

16. The circuit of claim 10 wherein said switching transistor is an FET.

17. The circuit of claim 10 wherein said switching transistor of a bipolar transistor.

18. A current driver circuit for applying a current to a switching transistor in a series current path including a motor coil and having a wide frequency bandwidth, comprising:
    first capacity for providing a high constant gain at low frequencies;
    second circuitry connected to receive an output of said first circuitry for producing a gain rolloff at medium frequencies;
    a feedback circuit for applying a signal related to a current in said series current path to said first circuitry;
    said first and second circuitry being connected to provide in combination with said motor coil a low gain above unity gain at frequencies between said medium frequencies to high frequencies at which a pole characteristic of the driver circuit that is created by said motor coil produces a gain rolloff.

19. The current driver circuit of claim 18 wherein said first circuitry comprises an operational amplifier.

20. The circuit of claim 19 wherein said operational amplifier has a single gain stage.

21. The current driver of claim 18 wherein said first circuitry comprises an operational transconductance amplifier.

22. The circuit of claim 21 wherein said operational transconductance amplifier has a single gain stage.

23. The circuit of claim 18 wherein said first circuitry comprises an operational amplifier, and wherein said feedback circuit is connected to an inverting input of said operational amplifier.

24. The circuit of claim 23 further comprising a sense resistor in said series current path across which a voltage is developed proportional to a current in said motor coil.

25. The circuit of claim 18 wherein said switching transistor is an FET.

26. The circuit of claim 18 wherein said switching transistor is a bipolar transistor.

27. A circuit for controlling a current in a load having an inductive component, comprising:

a transistor in a series current path with said load;

a high gain differential amplifier, having an input connected to receive a load driving signal from outside of said series current path;

a low gain amplifier having an input connected to receive an output of said high gain amplifier and having an output connected to control a current flow through said transistor; and a resistor and a capacitor connected in series, said series being connected between the input of said low gain amplifier and a reference potential;

said series providing a pole and a zero characteristic to reduce the open loop gain of the circuit at medium frequencies, and maintain a flat gain at high frequencies;

said resistor and capacitor being sized to establish that with increasing frequency a gain rolloff to below unity gain is first provided to said circuit by said inductive component of said load.

* * * * *